United States Patent [19]

Epps

[11] Patent Number: 5,029,162
[45] Date of Patent: Jul. 2, 1991

[54] AUTOMATIC GAIN CONTROL USING ROOT-MEAN-SQUARE CIRCUITRY IN A DIGITAL DOMAIN CONFERENCE BRIDGE FOR A TELEPHONE NETWORK

[75] Inventor: David C. Epps, Denver, Colo.

[73] Assignee: ConferTech International, Golden, Colo.

[21] Appl. No.: 490,047

[22] Filed: Mar. 6, 1990

[51] Int. Cl.[5] .......................... H04J 3/00; H04L 27/08
[52] U.S. Cl. ...................................... 370/77; 370/113; 370/119; 375/98
[58] Field of Search .................... 370/62, 113, 77, 119; 375/98; 455/239, 234; 330/254; 364/811, 812, 813, 814; 328/144, 173; 381/107, 108

[56] References Cited

U.S. PATENT DOCUMENTS

| | | | |
|---|---|---|---|
| 3,908,088 | 9/1975 | Gutleber | 370/104.1 |
| 3,958,084 | 5/1976 | Nicholas | 370/62 |
| 4,009,350 | 2/1977 | Cabet | 370/74 |
| 4,272,648 | 6/1981 | Agrawal et al. | 381/108 |
| 4,354,273 | 10/1982 | Areseki | 375/27 |
| 4,464,723 | 8/1984 | Chartier | 375/98 |
| 4,539,692 | 9/1985 | Munter | 375/98 |
| 4,626,629 | 12/1986 | Premoli | 370/110.3 |
| 4,691,176 | 9/1987 | Asiung et al. | 375/120 |
| 4,747,065 | 5/1988 | West | 375/98 |
| 4,775,988 | 10/1988 | Chevillat et al. | 375/98 |

OTHER PUBLICATIONS

"Telecommunications Transmission Engineering", AT & T Technologies, 1977, p. 250.

Primary Examiner—Douglas W. Olms
Assistant Examiner—H. Kizou
Attorney, Agent, or Firm—Dorr, Carson, Sloan & Peterson

[57] ABSTRACT

An automatic gain control for an inputted multiplex PCM data stream in a conferencing bridge in a telephone system. The inputted multiplexed data stream has a predetermined number of time slots wherein each time slot carries PCM speech data corresponding to an individual party in the conference call. The control of the present invention is capable of operating in μ-Law or A-Law companded format at a frequency of 192-256 kilobytes per second. The automatic gain control incorporates a digital root-mean-square meter, a COUNT sequence to change GAIN at predetermined intervals, and a set of GAIN rules to selectively increase or decrease GAIN based upon the output of the digital root-mean-square meter.

20 Claims, 8 Drawing Sheets

|  | TS0 | TS1 | | • | • | • | | TS31 |
|---|---|---|---|---|---|---|---|---|
| GAIN | | | | | | | | |
| COUNT | | | | • | • | • | | |

AUTOMATIC GAIN CONTROL USING ROOT-MEAN-SQUARE CIRCUITRY IN A DIGITAL DOMAIN CONFERENCE BRIDGE FOR A TELEPHONE NETWORK

BACKGROUND OF THE INVENTION

1. Field of the Invention - This invention relates to automatic gain control circuitry including a root-mean-square circuit and, more particularly, to an automatic gain control including a root-mean-square circuit for digitized audio channels in a multichannel multiplexed PCM data stream such as occurs in the digital domain conferencing bridge of a telephone network.

2. Statement of the Problem - An automatic gain control (AGC) is a term used to define a circuit and/or process for automatically obtaining a substantially constant amplitude output for an input signal having a range of variation. Numerous analog AGC circuits exist for controlling the audio output in radio and television receivers. Some analog AGC circuits use the root-mean-square (RMS) value of the input analog signal as part of the control.

A need exists for an automatic gain control incorporating an RMS circuit for use in the digital domain such as is found in a conferencing bridge of a telephone network. This is especially true in providing a circuit for controlling the gain of each digitized audio channel in a multi-channel multiplexed pulse-code-modulated (PCM) data stream. Such a control must be high speed and capable of operating at PCM data rates of 256 kilobytes per second.

3. Solution to the Problem - The present invention provides a high speed circuit and method for controlling the gain at each digitized channel in a multi-channel multiplexed PCM data stream which occurs on a conference bridge in a telephone network. The preferred embodiment controls the gain of each channel of a multichannel multiplexed PCM data stream carrying the digitized speech of the parties in a conference call. The circuit of the present invention is purely digital in operation and incorporates the use of a digital RMS meter.

SUMMARY OF THE INVENTION

The present invention sets forth an automatic gain control for the inputted multiplex PCM data stream in a conferencing bridge for a telephone system. The automatic gain control of the present invention responds to the PCM data stream in the frequency range of 192–256 kilobytes. The inputted multiplexed data stream has a predetermined number of time slots wherein each time slot carries PCM speech data corresponding to an individual party in the conference call. The device of the present invention is capable of operating in $\mu$-Law or A-Law companded format.

The present invention uses a device for determining the root-mean-square PCM values of the inputted multiplex PCM data stream. A random access memory is utilized to receive the inputted multiplexed PCM data stream for storing the PCM speech data in each of the time slots over a period of time involving a number of measurement samples. An EPROM look-up table is used to determine the linear difference between the square of the input PCM speech data and of the corresponding occurring at the beginning of the measurement. The difference between the two squares of these values is then delivered to an adder. In the device of the present invention, an accumulator contains the linear value of the existing sum of squares of all of the speech data contained in the random access memory over the measurement. This value is also delivered to the adder so that the adder can add the linear difference from the look-up table to the value in the accumulator to update the sum of squares value to be maintained in the accumulator. Hence, for each new PCM speech data occurring in a time slot, the device of the present invention squares that value adds it to the sum of squares while at the same time subtracting the square of the corresponding speech data value occurring at the beginning of the measurement. At any given time, therefore, the accumulator contains the existing sum of square values. To determine the RMS value, the updated sum of square values is averaged and the average has its square root taken. The resultant output RMS value provides a running RMS value over the entire sampling. The device of the present invention receives the speech data in PCM format, performs the RMS determination in linear format and outputs the running root-mean-square value in PCM format.

The automatic gain control of the present invention incorporates a gain history memory for storing count and gain values for each time slot in the inputted multiplexed PCM data stream, an attack and decay control circuit for controlling the gain value for time slot, an AGC look-up table which contains a set of gain rules for selectively incrementing or decrementing the prior gain value for each time slot based upon the correct RMS value and an amplifier which amplifies the speech data by the amount of determined gain.

Under the teachings of the present invention, each time slot stores a COUNT value which permits the gain to be modified only after a predetermined time has been counted down.

DETAILED SPECIFICATION

1. General Discussion

Figure 1:
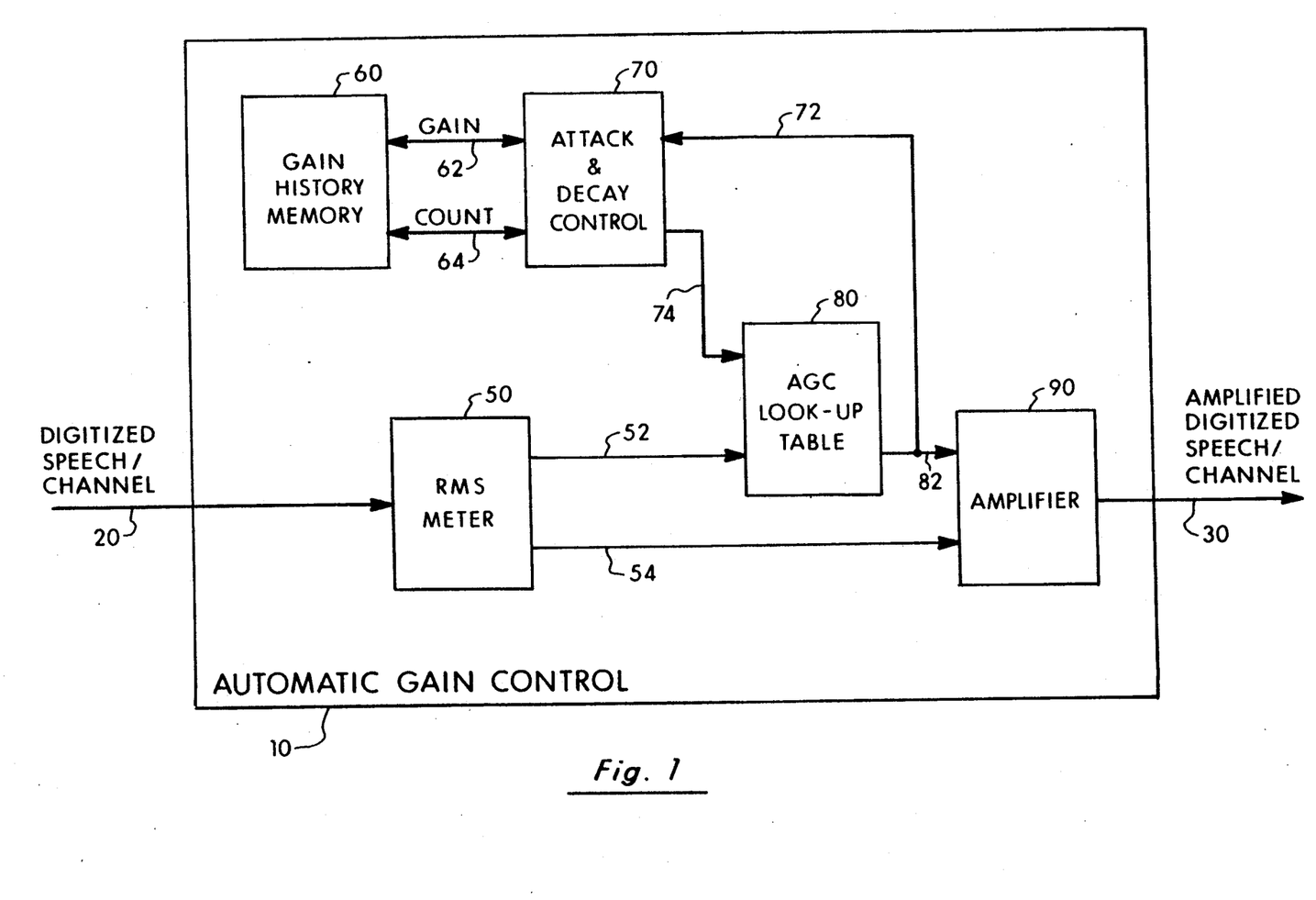
FIG. 1 is a block diagram showing the automatic gain control of the present invention.

In FIG. 1 an automatic gain control (AGC) 10 of the present invention is shown for a 32 channel mutiplexed PCM data stream. The multiplexed PCM data stream appears at input 20 to the AGC 10 of the present invention and the amplified digitized speech appears on output 30. The teachings of the present invention are not limited to a system involving 32 channels and can comprise any suitable predetermined number of channels. The present invention is based upon the CEPT (Conference Europeanen des Administrations des Postes et des Telecommunications) Standard for digitized speech transmission on the telephone network. The CEPT Standard utilizes 32 time slots (i.e., channels) at a frequency of 2.048 megabits per second. Each CEPT time slot carries eight bits of speech data. The present invention could also be utilized for a 24 channel standard as found in the United States T1 Carrier Standard which utilizes 24 time slots (i.e., channels) at a frequency of 1.544 megabits per second. The T1 carrier standard also utilizes eight bits of speech data per time slot. Each time slot carries individual speech data corresponding to a different party to a conference call.

The automatic gain control circuit 10 of the present invention includes an RMS meter 50, a gain history memory 60, an attack and decay control 70, an AGC look-up table 80, and a table look-up amplifier 90.

The RMS meter 50 receives the digitized speech per channel over lines 20 and is interconnected with the AGC look-up table 80 over lines 52 and with the table look-up amplifier 90 over lines 54. The gain history memory receives gain information over lines 62 and count information over lines 64. The attack and decay control 70 communicates with the table look-up amplifier 90 over lines 72 and with the AGC look-up table 80 over lines 74. The AGC look-up table is further interconnected with the table look-up amplifier 90 over lines 82. Finally, the table look-up amplifier 90 is interconnected to deliver amplified digitized speech per channel over output 30.

The details for each of these components are discussed in the following. The present invention provides a totally digital automatic gain control which operates at the high PCM data rates in the frequency range between 192 to 256 kilobytes per second.

2. RMS Meter 50

Figure 2:
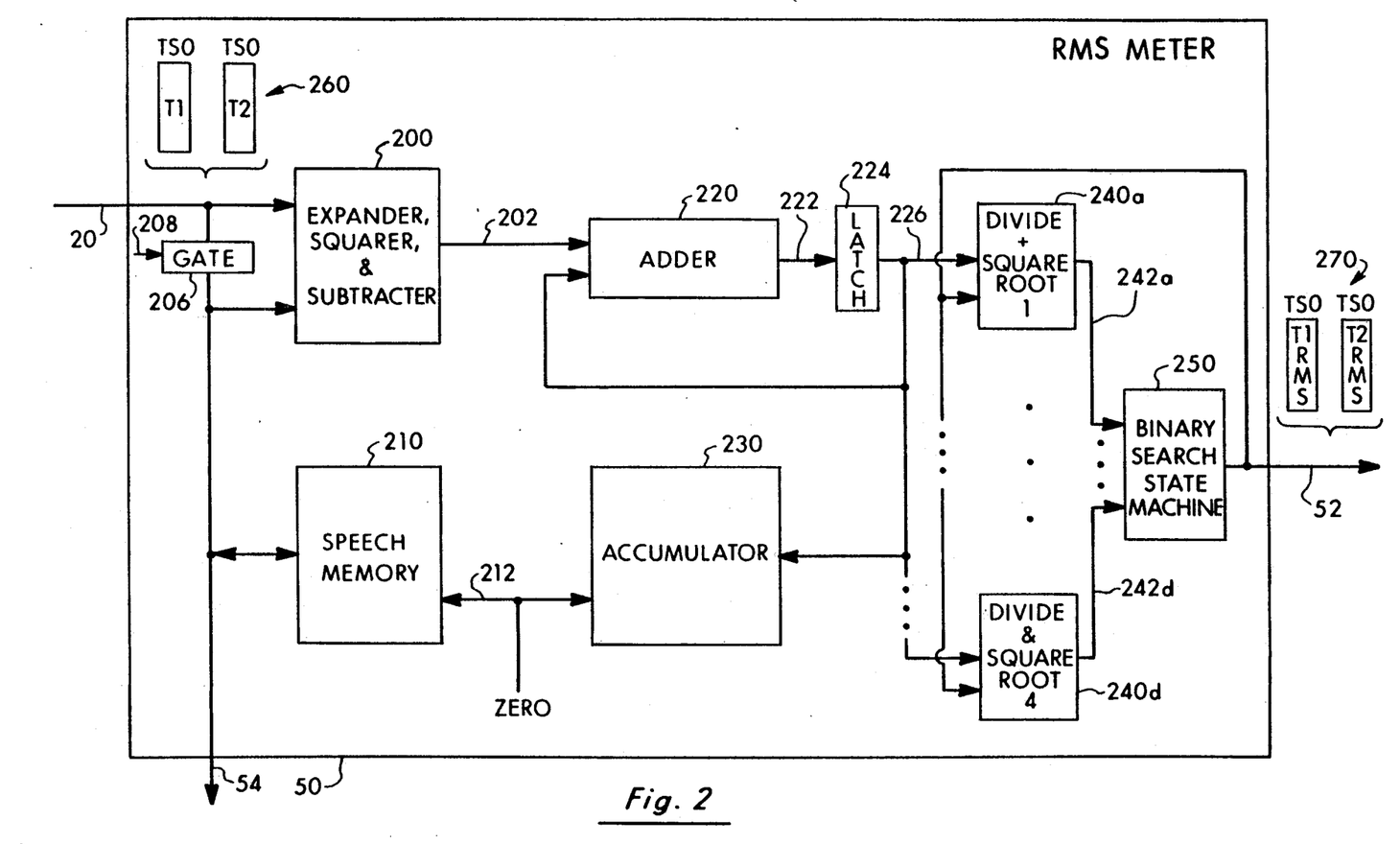
FIG. 2 sets forth the block diagram details of the RMS meter 50 of the present invention.

In FIG. 2, the details of the RMS meter 50 of the present invention are set forth. The term "root-mean-square" (RMS) is defined as the square root of the average of the squares of the sampled taken over the measurement duration.

The RMS meter 50 of the present invention utilizes an expander, squarer and subtractor circuit 200, a speech memory 210, an adder circuit 220, an accumulator 230, four divide and square root circuits 240, and a binary search state machine 250 in the preferred embodiment.

The RMS meter 50 accepts as an input on line 20 the eight bit $\mu$-Law companded PCM speech data per channel and provides on output 52 a running root-mean-square level of the digitized speech input. The RMS meter 50 of the present invention calculates the root-mean-square-level on each of the 32 input channels. The present invention can be easily converted to the A-Law companding format of PCM data by simply changing out the look-up tables in the expander, squarer and subtractor circuit 200 and in the divide and square root circuits 240. The RMS meter 50 also provides delayed PCM speech data over lines 54 to the table look-up amplifier 90 thereby realizing a forward estimation AGC.

The RMS meter 50 digitally implements the conventional $$V_{RMS} = (_{t=0}\Sigma^T V_t^2 / T)^{\frac{1}{2}} \qquad \text{FORMULA 1}$$

formula for calculating the root-mean-square value of a non-periodic wave form:
 where T = number of samples
 V = current PCM speech data (eight bit)
 t = a given sample in time In the preferred embodiment, the overall measurement period for T is 48 having a time period of six milliseconds. V represents the speech data input on lines 20 in $\mu$-Law or in A-Law companded PCM form. $V_{RMS}$ represents the running RMS voltage output on lines 52 also in $\mu$-Law or A-Law companded digital form and is updated for every $V_t$ input. The RMS voltage output $V_{RMS}$ is always positive. Formula 1 is solved by the present invention in two parts: (a) determining the sum of squares and then (b) by dividing by T and taking the square root.

In the preferred embodiment of the FIG. 2, the received PCM digitized speech $V_t$ is delivered on lines 20 to the expander, squarer and subtractor circuit 200. This circuit is connected over lines 202 to the adder 220 and receives delayed digitized speech $V_{t-T}$ on lines 54 from speech memory 210. The speech memory 210 also receives the inputted digitized speech on lines 54 and is further connected over lines 212 to a zeroed meter counter input (zero). The adder 220 delivers an output over lines 222 to a latch 224 which has an output on lines 226. Output lines 226 are delivered into the accumulator 230 and the output 226 of the accumulator is fed back into the adder 220 as shown in FIG. 2. The four divide and square root circuits 240 deliver an output over lines 242 to the binary state machine 250. The output of the binary state machine 250 is a running RMS level 270 of the received speech data 260 appearing on line 52 which is also delivered back as an input to the divide and square root circuits 240.

As shown in FIG. 2, at the digitized speech input 20, and for the example of time slot TS0, two eight bit digitized speech values are shown at times T1 and T2. This is generally designated as 260 in FIG. 2. The RMS meter 50 of the present invention generates the RMS level for the digitized speech values appearing in time slot TS0 over a given time as generally shown by 270 at output 52 which represent the RMS values. The given time in the preferred embodiment is T = 48 samples for a total of 6 milliseconds. The present invention is not limited to using 48 time samples as other values for T such as 36 or 60 time samples could be utilized. The input at 260 on lines 20, in the preferred embodiment, is seven parallel bits representing the absolute value of the received digitized speech for a time slot and the output on lines 52 is seven parallel bits representing the RMS value of the received digitized speech.

It is to be expressly understood that in the preferred embodiment, for CEPT standards, 32 channels are delivered into circuit 50 corresponding to time slots TS0 through TS31 and for the T1 standard, 24 channels would be delivered for time slots TS0 to TS23. In the following, the disclosure is primarily limited to processing speech data in one time slot.

Figure 3:
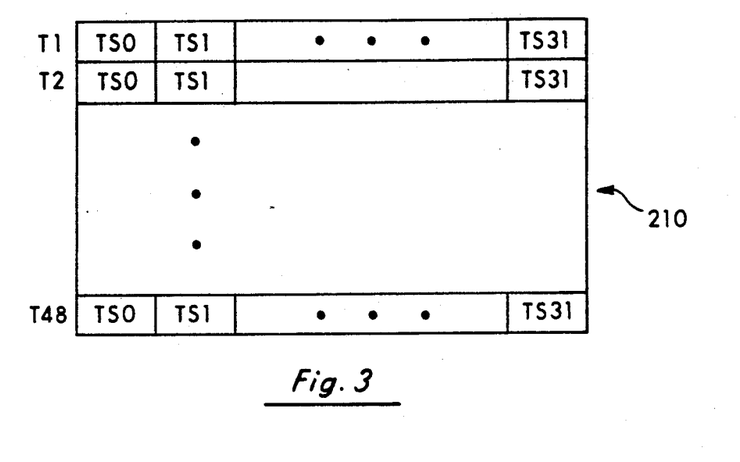
FIG. 3 is an illustration setting forth the memory layout of the speech memory 210 of the present invention.

In FIG. 3, the speech memory 210 is disclosed which, in the preferred embodiment, is a two K-byte random access memory capable of storing 1536 bytes (i.e., 32 PCM time slots×48 samples). The speech memory 210 is implemented in a conventional 6264 read/write static memory. In the preferred embodiment, the predetermined number of T of time samples or periods is 48. These are stored in memory 210 and, as shown in FIG. 3, the memory layout is for the CEPT standard of 32 time slots. Upon power turn on, and by placing a zero on lines 212, the memory 210 is initially zeroed. While the present invention contemplates use of a read and write random access memory for speech memory 210, it is to be expressly understood that other suitable memory devices could also be used.

Figure 4:
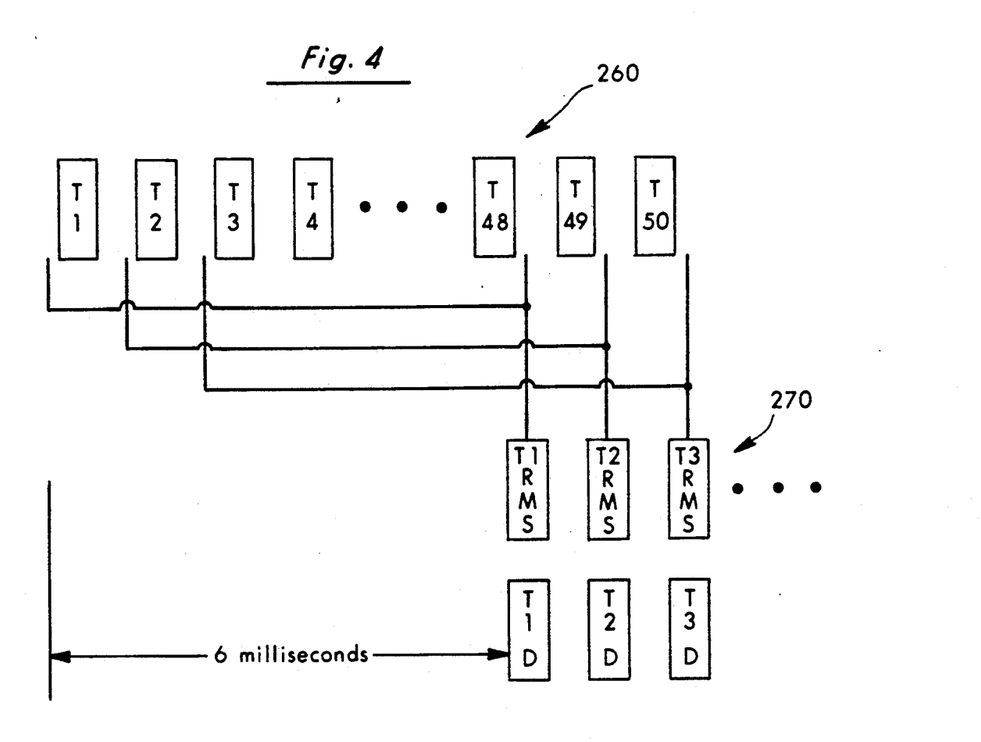
FIG. 4 illustrates the RMS outputs of the present invention in conjunction with the delayed speech data outputs of the present invention.

In FIG. 4, the input digitized speech values 260 for times T1 and T2 are shown for a particular time slot such as TS0. Formula 1 is utilized, for example, to calculate the RMS value at time T1 on the output based upon the prior 47 values of input data. Hence, a running RMS set of values 270 for times T1 and T2 are outputted based upon the contents of speech memory 210 which contains a history of the prior 47 speech data values. Each new speech data input into the speech memory of FIG. 3 causes the oldest speech data (i.e., $V_{t-T}$) to be taken out. The formula is then recalculated by the RMS meter 50 of the present invention. Speech memory 210 provides six milliseconds of delay so that a forward estimation of AGC is obtained. The speech memory could be designed to provide any amount of delay required.

a. Implementation of Formula 1

The high speed calculation of the root-mean-square is purely digital in operation and will now be explained with respect to Formula 1. Formula 1 is solved for discrete PCM values in two parts with eight bit registers holding temporary values. Each part of Formula 1 is calculated in approximately 3.9 microseconds based upon one channel time at a data rate of 256 kilobytes per second.

b. Sum of Squares Calculation

Figure 5:
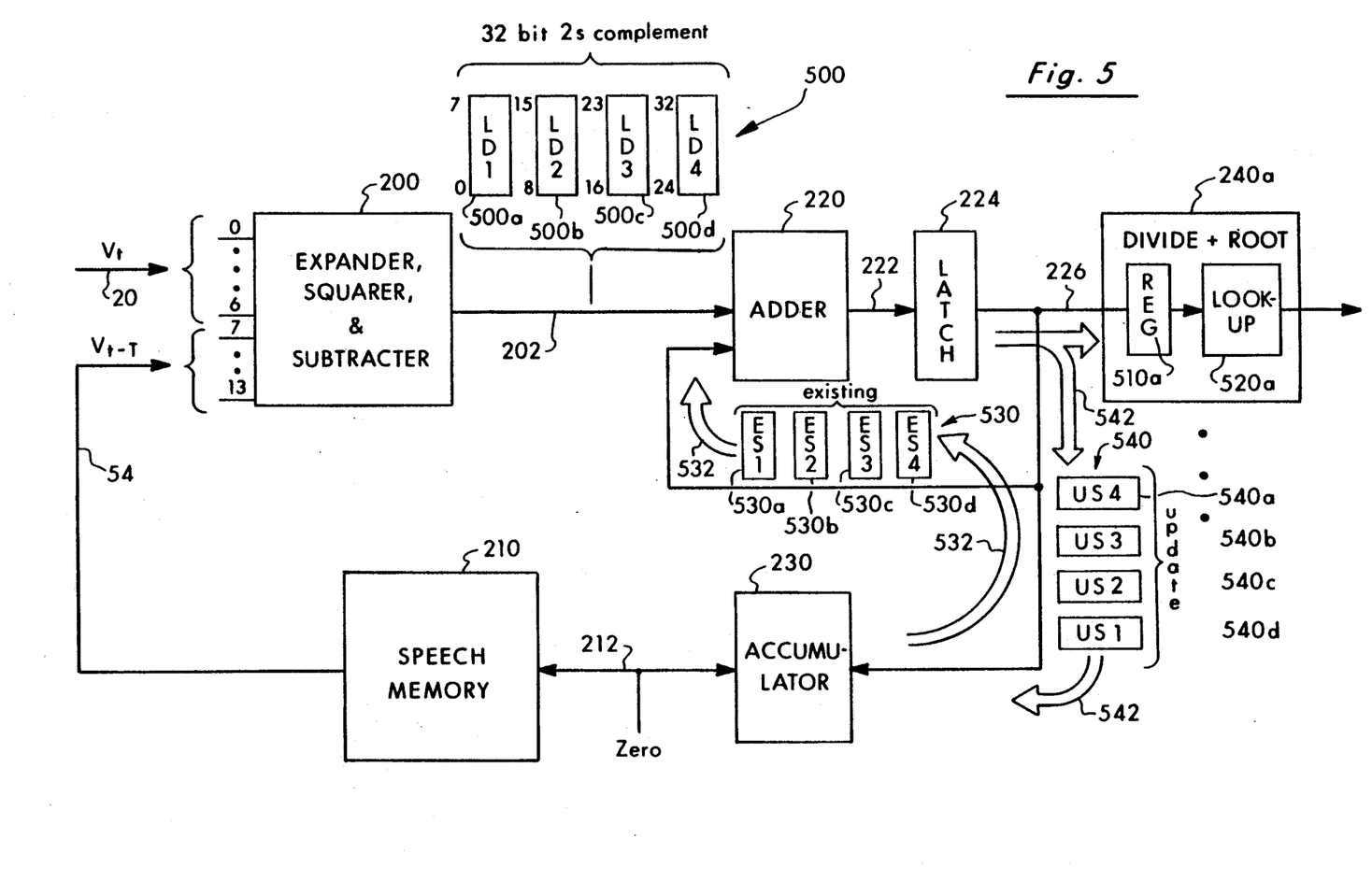
FIG. 5 illustrates the four stage pipelining effect, in linear format, of the determination of the sum of squares technique of the present invention.

In FIG. 5, the expander, squaring, and subtractor circuit 200, adder 220 and accumulator 230 performs the first part of Equation 1 which, involves determining the sum of squares (i.e., $\Sigma^{T}_{t=0} V_t^2$). The first part of the calculation determines the difference between the square of the current input value ($V_t^2$) and the square of the input value one measurement period (i.e., T=48 or 6 milliseconds) earlier ($V^2_{t-T}$).

The input $V_t$ PCM bits 0–6 of speech data 260 are set up on addresses 0–6 of the expander, squarer and subtractor circuit 200. Simultaneously, the $V_{t-T}$ PCM bits of speech data inputted at the time minus the measurement period is delivered from speech memory 210 over lines 54 and into the expander, squarer and subtractor circuit 200 at addresses 7–13. The polarity of the PCM sample in bit 8 is ignored as it is factored out by squaring. Circuit 200 is an EPROM look-up table and the output of the look-up table is based on the linear difference (LD) between the combined addresses on bits 0–13 which is delivered on lines 202. The linear difference function of circuit 200 is implemented in a conventional 27C512 and accepts as its input the PCM $V_t$ and $V_{t-T}$ values. The linear difference look-up table in the 27C512 squares the input values and outputs the difference between $V_t^2$ and $V^2_{t-T}$ in a 32 bit linear format. It is to be expressly understood that while an EPROM look-up table is used in the preferred embodiment that other linear difference determination.

The output on lines 202 is based upon the following formula:

$$LD = (LINEAR13(V_t))^2 - (LINEAR13(V_{t-T}))^2 \quad \text{FORMULA 2}$$

where:
LD = Linear Difference
LINEAR13 represents the 13 bit linear expansion of the PCM value The look-up table of circuit 200 expands the $\mu$-Law or A-Law encoded PCM input values to linear 13 bit codes and subtracts the square of the ($V_{t-T}$) sample from the square of the V current sample. The result is a 32 bit 2's compliment number output on bits 0–7 on lines 202 in four pipeline cycles and is termed the linear difference (LD).

The circuitry 200 of the present invention simply subtracts $V^2_{t-T}$ from the current input $V_t^2$ and adds the difference to the existing sum of squares (i.e., $\Sigma V_t^2$) already stored in the accumulator 230 all of which occurs in linear format.

This is illustrated in FIG. 5 where the expander, squarer and subtractor circuit 200 has $V_t$ on inputs 0–6 and $V_{t-T}$ on inputs 7–13. The output 500 on lines 202 are the four partial results being delivered over four cycles in pipeline fashion to adder 220. Adder 220 is an eight bit adder implemented in two conventionally available 74HCT283 four bit adders. The output of the adder 220 is delivered into latch 224. The four cycle output on lines 226 from the accumulator 230 (arrows 532) represents the existing sum of squares value 530 which is added to the linear difference 500 by adder 220. The four cycles of the existing sum (ES) of squares value 530 is read from accumulator 230 over lines 226 and in the intervening cycles an updated sum (US) of squares value 540 in linear format is written back into the accumulator 230 and simultaneously into the partial sum register 510a of the divide and root circuit 240 (as shown by arrows 542). During the last cycle of operation, the current input PCM $V_t$ value is written to the speech memory 210 over lines 54. The existing sum of the squares 540 is always positive and is stored in the accumulator 230 until the next PCM signal (i.e., $V_{t-1}$) is input. It is to be understood that while a four stage pipeline is shown that the present invention is not limited to four stages or to the use of a pipeline.

The accumulator 230 is implemented in a conventional 6064 read/write static memory and provides storage for the running summation of the squares. Four write cycles are required to store the 32 bit sum of squares. It is to be expressly understood that while the present invention uses a read/write static memory for accumulator 230 that other designs may be implemented to perform the same function.

The first part of the calculation of Formula 1 as set forth above in Equation 2 requires eight states to provide an output 32 bit sum of the squares value according to Formula 2. The states are set forth in Table I as follows and are appropriately implemented in the circuitry as timing and controls (not shown):

TABLE I

| State | Conditions |
|---|---|
| 0 | a. Current PCM $V_t$ value 260 is set up at inputs 0-6 of circuit 200.<br>b. The PCM $V_{t-T}$ value T=48 samples ago is set up at inputs 7-13 of circuit 200 over lines 54 from speech memory 210.<br>c. LD bits 0-7 (500a) are read from circuit 200 and set up at inputs of adder 220.<br>d. The low order byte of the 32 bit existing summation (ES) of squares 530a is output on lines 226 from the accumulator 230 and set up on the adder 200.<br>e. Deliver bits 0-7 of the updated sum (US) of squares 540a into latch 224. |
| 1 | a. Bits 0-7 (540a) of the updated sum of the squares is overwritten to the accumulator 230 over lines 226.<br>b. The $V_{t-T}$ PCM speech data value is read from memory 210 and presented on the delayed bus 54.<br>c. If the zero signal 212 is asserted, zero is written to the accumulator 230 instead of the undated sum of the squares 540a over line 226.<br>d. The updated sum of squares bits 0-7 (540a) is written to the partial sum register 510a of divide and root circuit 240a. |
| 2 | a. LD bits 8-15 (500b) are read from circuit 200 and set up at the inputs of adder 220.<br>b. The existing sum of squares bits 8-15 (530b) are read from the accumulator 230 and set up at the inputs of the adder 220 over lines 226.<br>c. The updated sum of squares bit 8-15 (540b) is delivered into latch 224. |
| 3 | a. The output of latch 224 containing the updated sum of squares bits 8-15 (540b) is written to the accumulator 212 and written to the partial sum register 510b of divide and root circuit 240b. |
| 4 | a. The LD bits 16-23 (500c) are output from circuit 200 and set up at the adder 220.<br>b. The existing sum of squares bits 16-23 (530c) are output from the accumulator 230 and set up at the input of the adder 230.<br>c. The updated summation of squares bits (540c) 16-23 are delivered into latch 224. |
| 5 | a. The updated sum of squares bits 16-23 (540c) are written to the accumulator 230.<br>b. The updated sum of squares bits 16-23 (540c) are written to the partial sum register 510c of divide and root circuit 240b. |
| 6 | a. The LD bits 24-31 (500d) are output from circuit 200 and set up at the input of the adder 220.<br>b. The existing sum of square bits 24-31 (530d) are output from the accumulator 230 and are set up at the input of the adder 220.<br>c. The updated sum of square bits 24-31 (540d) are delivered into latch 224. |
| 7 | a. The updated sum of square bits 24-31 (540d) are written to the accumulator 230.<br>b. The updated sum of square bits 24-31 (540d) are written to the partial sum register 510d of divide and root circuit 240b. |

Each of the above states takes 488 nanoseconds for a total time of nominally 3.9 microseconds. The RMS meter 50 is controlled by a programmable logic device (PLD) which is programmed to operate according to the states and conditions set forth in Table I.

Figure 6A:
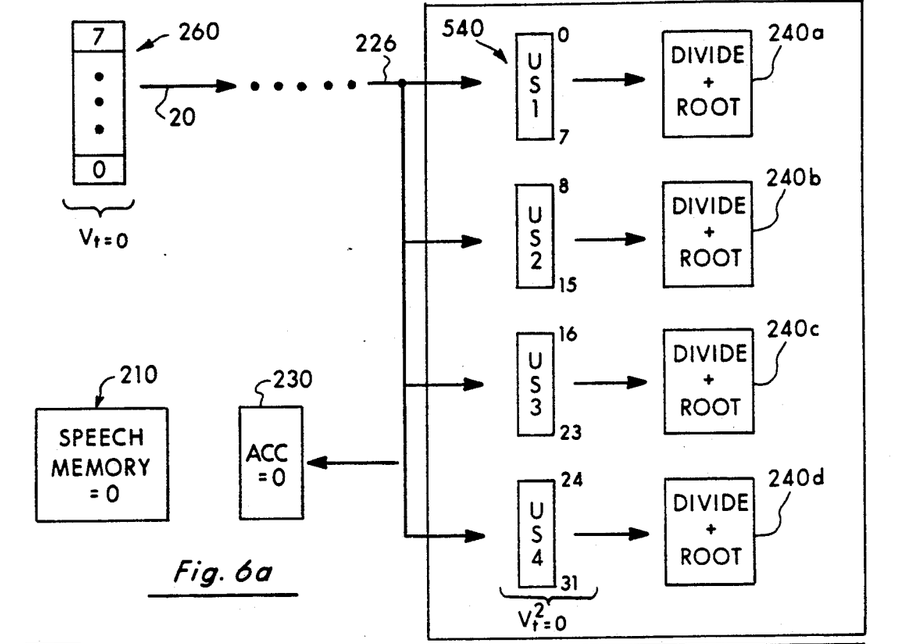
FIG. 6a sets forth the initialization of the device of the present invention.

In FIG. 6a, the initial conditions for the first stage of processing are shown. The input voltage 260 at T=0 is V=0 and is delivered on input lines 20. This is processed by the expander, squarer and subtractor circuit 260 and is delivered into the divide and root circuit 240 as a 32 bit squared value. Initially the speech memory 210 is zeroed as well as the accumulator 230 by activation of a zero on line 212. All of the eight states set forth in Table I are complied with and at a time delay of 488 nanoseconds for each state, a total of 3.9 microseconds elapses. To process the full 32 channels takes 125 microseconds. This ability to process 32 channels in 125 microseconds is an important feature of the present invention.

Figure 6B:
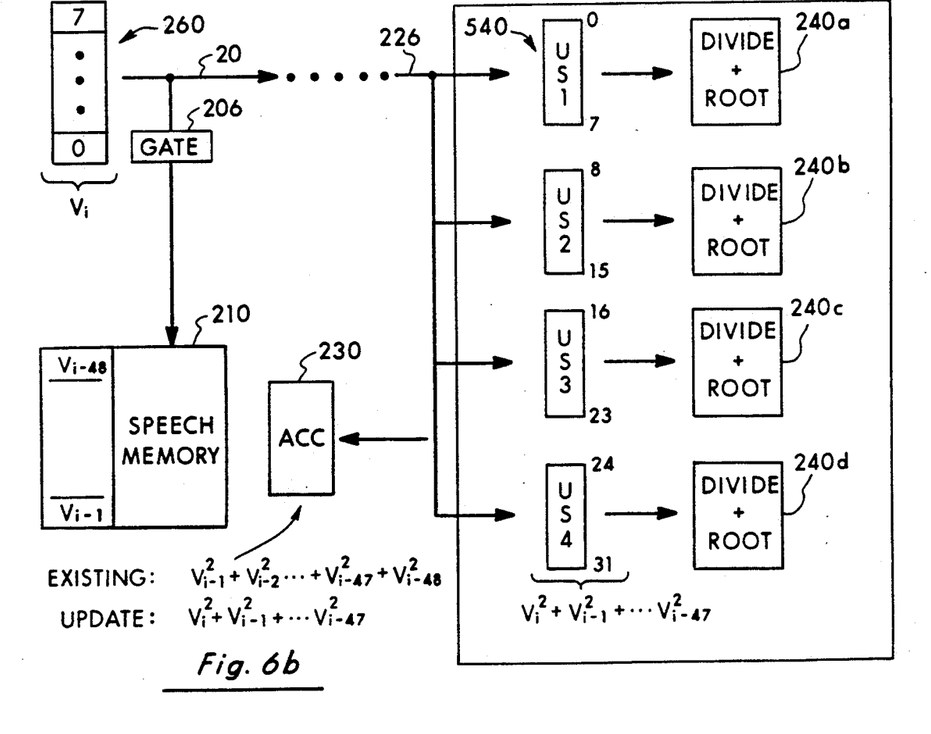
FIG. 6b sets forth the summation of squares values during operation of the present invention.

In FIG. 6b, PCM speech data having a voltage $V_i$ at time i is delivered on lines 20 and is processed for delivery over lines 226 into the divide and root circuits 240 as 32 bit linear data 500. At the time $V_i$ is inputted, the existing sum (ES) of squares value is stored in the accumulator 230 as: $V^2_{i-1} + V^2_{i-2} + \ldots V^2_{i-47} + V^2_{i-48}$. This existing sum of squares value is in linear 32 bit format and can be represented as $\Sigma(\text{LINEAR13}(V))^2$. The linear difference output on lines 226 is $V^2_i - V^2_{i-48}$ which is added to the existing sum of squares to result in an updated sum (US) of squares value of $V^2_i + V^2_{i-1} + \ldots V^2_{i-46} + V^2_{i-47}$. The value for $V_{i-48}$ is delivered out over line 54.

c. Determine the Average of the Square Root

Figure 7:
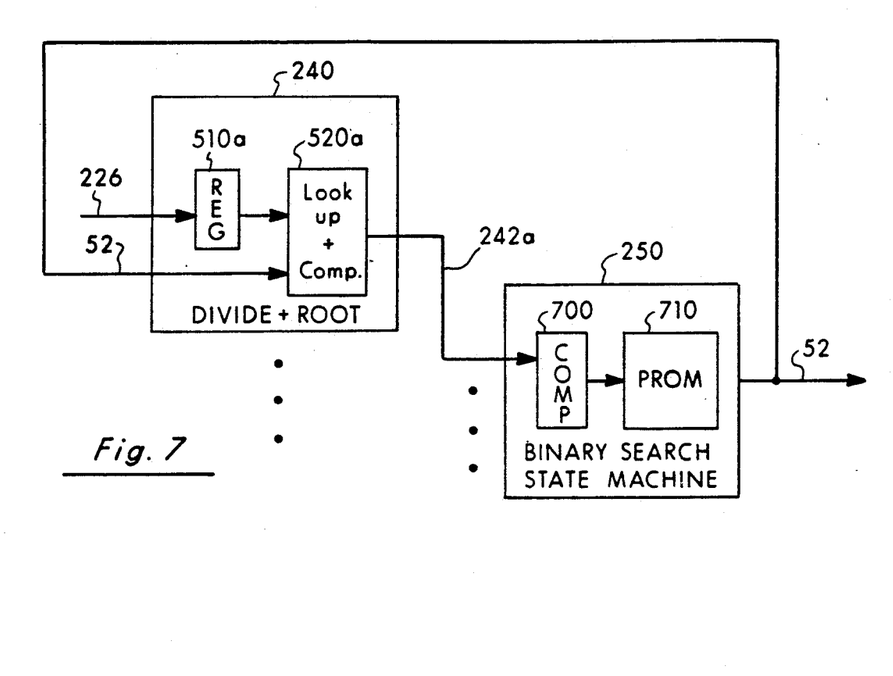
FIG. 7 sets forth the block diagram details for the divide and square root feature of the present invention.

The second part of the calculation of Formula 1 is to determine the average of the sum of squares, take the square root and then output in a $\mu$-Law or A-Law encoded RMS PCM signal $V_{RMS}$ and is implemented in the circuitry of FIG. 7.

As mentioned, the four 8-bit partial linear updated sum of squares has been latched into registers 510a of the divide and root circuits 240. These are buffers which are conventional 2 byte EIFOs implemented in two 74HCT273. The buffers provide a temporary holding register 510a for the 32 bit updated sum of squares 540 on line 226 prior to performing the division and the square root.

Each divide and root circuit 240 also contains an EPROM look-up table 520a which serves as a comparator. The look-up table 520 is implemented in a conventional 27C512 with the updated sum of squares in registers 510 serving as a first set of inputs and a targeted RMS value from the binary state machine 250 serving as the second input. In the configuration of the present invention as shown in FIG. 2, four divide and square root circuits 240 are required. Each divide and square root circuit 240 does the comparison for its 8 bit portion (US1 through US4) of the input 32 bit number updated sum of squares. The divide and square root circuit 240 compares the square of the targeted RMS value times the measurement period T to the input 8 bit portion and delivers an output on lines 242 indicating greater than, less than or equal to. It is to be expressly understood that while the present invention uses an EPROM look-up table that other suitable designs may be implemented to perform the same function.

This part of the calculation of Formula 1 is implemented in the finite state machine 250 which in eight cycles completes a binary search of all possible 128 companded RMS outputs for the one RMS output which matches the input updated sum of squares. The binary search state machine 250 is implemented in a conventional 82HS641 PROM structured as a state machine. The output is delivered back to provide previous state feedback. The state machine 250 accepts the "less than", "greater than", and "equal" inputs over lines 242 from the divide and square root circuit 240 and delivers the target RMS value over line 52 back to the divide and root circuit 240.

The look-up table 520a internally converts the input at 52 to a 32 bit sum using the following equation:

$$\Sigma^T_{t=0}(LINEAR13(V_t))^2 = (LINEAR13(V_{target}))_{2 \times T} \quad \text{FORMULA 3}$$

where $\Sigma^T_{t=0}(LINEAR13(V_t)^2)$ exists in register 510
T = number of samples
$V_{TARGET}$ = Target $V_{RMS}$ on line 52

The outputs of the four EPROM look-up tables 520a are compared in parallel in a four bit comparator 700 contained in the binary search state machine 250. In the preferred embodiment, comparator 700 is a conventional 74HC85 four bit comparator. Comparator 700 resolves the $<$, $>$, $=$ signals for delivery to the PROM 710. If the output value from the look-up table 520a based on the 32 bit sum of squares in register 510a is greater than the target RMS value $V_{TARGET}$ from the state machine 250 then the binary search state machine will advance to the next cycle and output a new target RMS value higher than the previous candidate until the search is complete.

In the preferred embodiment, the binary search will be completed after the eighth cycle and does not cycle further. This is a condition implemented by the binary search state machine 250. The binary search is implemented in a state machine consisting of the binary search PROM whose output is the target RMS value. The binary search PROM is designated 710.

In Table II, the following states and state variables occur.

TABLE II

| States | State Variables |
|---|---|
| 0 | a. The target RMS value $V_{TARGET}$ of 64 is provided to look-up table 520a over lines 52 to start the binary search.<br>b. The updated sum of the square (US) value is loaded into register 510a.<br>c. The target RMS value and the updated sum of the squares bits 0–31 are set up at the inputs of the divide root EPROMS 520a.<br>d. The updated sum of the squares is compared to the square of the target RMS value times the measurement period (i.e., $V^2_{TARGET} \times T$).<br>e. A greater than ($>$), less than ($<$), or equaled ($=$) signal is generated on line 242. |
| 1 | If the updated sum of the squares value exactly equals the square of the targeted RMS value times the measurement period then the done output of the binary search PROM 710 is asserted to indicate that the targeted RMS value is valid. |
| 2–6 | Binary search proceeds as above further splitting the high and low differences in half until at state 7 the done signal will be asserted. |
| 7 | In the final state the targeted RMS value is delivered out from the RMS |

TABLE II-continued

| States | State Variables |
|---|---|
| | meter 50 as $V_{RMS}$. |

Figure 8:
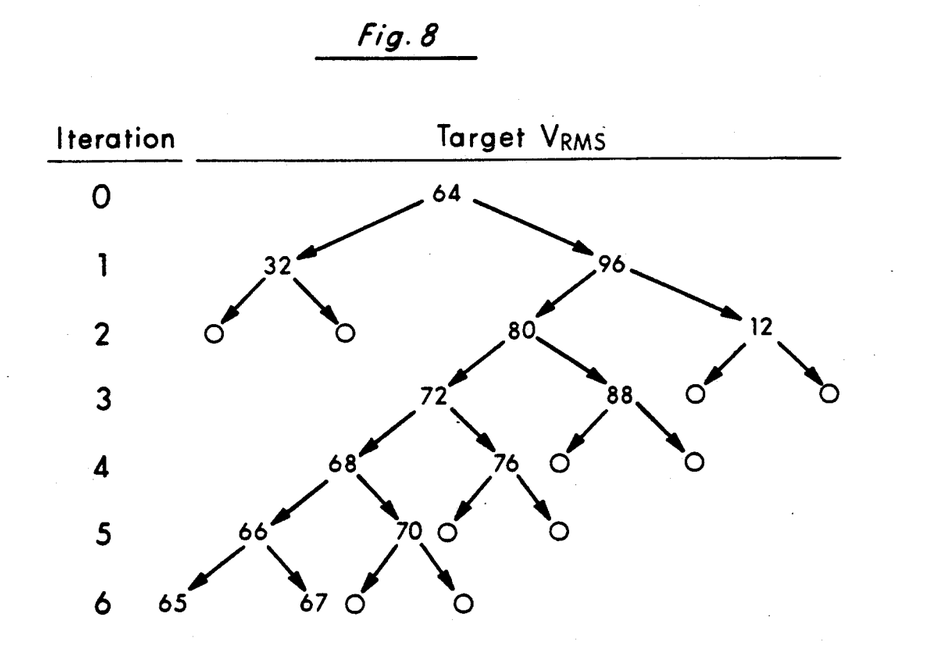
FIG. 8 sets forth the iterative process for determining the RMS value output of the present invention.

In FIG. 7, if a simple look-up table 710 were utilized in the state machine 250, the memory would have to be greater than one gigabyte. In order to reduce the amount of memory required, an iterative search according to the bubble chart in FIG. 8 is utilized. The process for matching the targeted RMS value delivered onto the divide and root circuit 240 occurs according to the iterative sequence in FIG. 8. FIG. 8 is simply an illustration of the iterative process between values 1–128. A mid-point value at 64 is selected and then a determination is made as to whether or not the value stored in latch 510 of the divide and root circuit 240 is greater than or less than the value at iteration equals zero. If greater, the next mid-point value is selected (i.e., 96) and the iterative process continues in the manner shown. For example, if the value of $V_{RMS}$ stored in the register 510 is 72, four iterations are required. If the value of $V_{RMS}$ based upon the sum of squares is 65 then the full seven iterations are required. Hence, under the teachings of the present invention, while a smaller memory is required, more time is taken to ascertain the value of the look-up table.

Returning to FIG. 1, it is to be understood that the RMS meter 50 of the present invention operates on the digitized speech per channel appearing on lines 20 so that a running RMS value over the prior 6 millisecond period (including 48 samples) is generated on line 52 (for example, T1$_{RMS}$ in FIG. 4) and on line 54 the corresponding PCM value is delayed 6 milliseconds by the speech memory in order to provide a forward estimate on line 54 (for example, T1$_D$ in FIG. 4).

3. AGC LOOK-UP TABLE 80

The AGC look-up table 80, as shown in FIG. 1 receives the PCM RMS value ($V_{RMS}$) from the RMS meter 50 over lines 52. The AGC look-up table is also connected to the attack and decay control 70 over lines 74 and to the table look-up amplifier circuit 90 over lines 82. Under the teachings of the present invention, the current signal amplitude $V_{RMS}$ is used to determine the current gain setting.

Lines 74 from the attack and decay control 70 contain previous gain information. For example, if the previous gain on lines 74 does not equal the present gain required to amplify the $V_{t-T}$ signal to obtain a constant amplitude output as delivered on lines 54, then the output of circuit 80 is a new gain created by adding an increment of gain to the previous gain. On the other hand, if the previous gain on line 74 is less than the gain of the RMS value on line 52, then the AGC look-up table 80 outputs a new gain over line 82 which is less than the previous gain by a minus increment.

AGC look-up table 80 is incorporated in a conventional 27C512 EPROM look-up table which used to calculate the current gain setting given the past gain setting on line 74 and the current RMS level on line 52.

The look-up table 80 is constructed in the present invention to implement gain rules by comparing the previous gain setting over lines 74 to the gain as determined by the received RMS level on line 52 and adding 1 dB to increment gain or subtracting 1 dB to decrement gain. It is to be expressly understood that the AGC look-up table 80 may be programmed to implement such a linear gain plot or any other desired gain plot. For example, the look-up table 80 may implement a gain plot that provides rapid decay for increasing RMS levels on line 52 while slowly increasing the gain for decreasing RMS levels.

4. ATTACK AND DECAY CONTROL 70

The attack and decay control 70 is implemented in an EP900 which is a conventional programmable logic device. This device is configured to implement the slope counter and steering logic necessary to route previous gain settings from the gain history memory 60 to the look-up table 80. The attack and decay control 70 provides gain information over lines 62 to memory 60 and count information over lines 64 to memory 60. The attack and decay control 70 also generates the read, write, and address control signals for the gain history memory 60.

5. GAIN HISTORY MEMORY 60

The gain history memory 60 is a read/write static memory. Under the teachings of the present invention, the gain history memory 60 is implemented in a conventional 6064 static memory.

Figure 9:
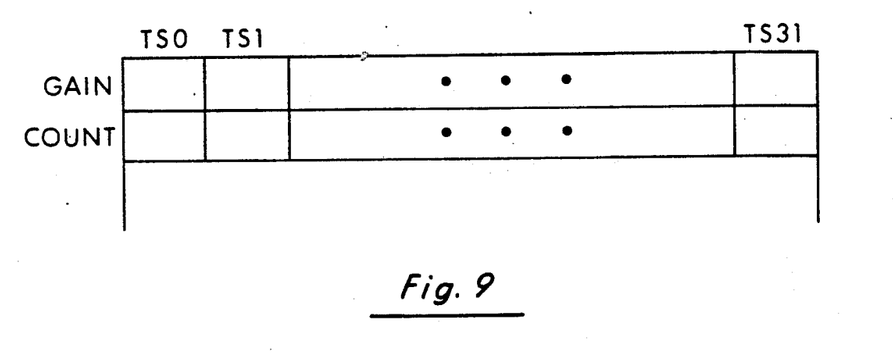
FIG. 9 is an illustration setting forth the memory layout of the gain history memory of the present invention.

In FIG. 9, the layout of the gain history memory 60 is set forth. For each time slot two values are stored—the previous GAIN setting and the COUNT.

6. AMPLIFIER 90

Amplifier 90 is implemented as a look-up table in an EPROM. The encoded PCM data which is delayed is delivered on lines 54 which corresponds to the forward estimate of RMS voltage at 52. The gain of the amplifier is delivered on lines 82. Amplifier 90 is implemented in a conventional 27C512 EPROM.

7. OPERATION OF AGC

Figure 10:
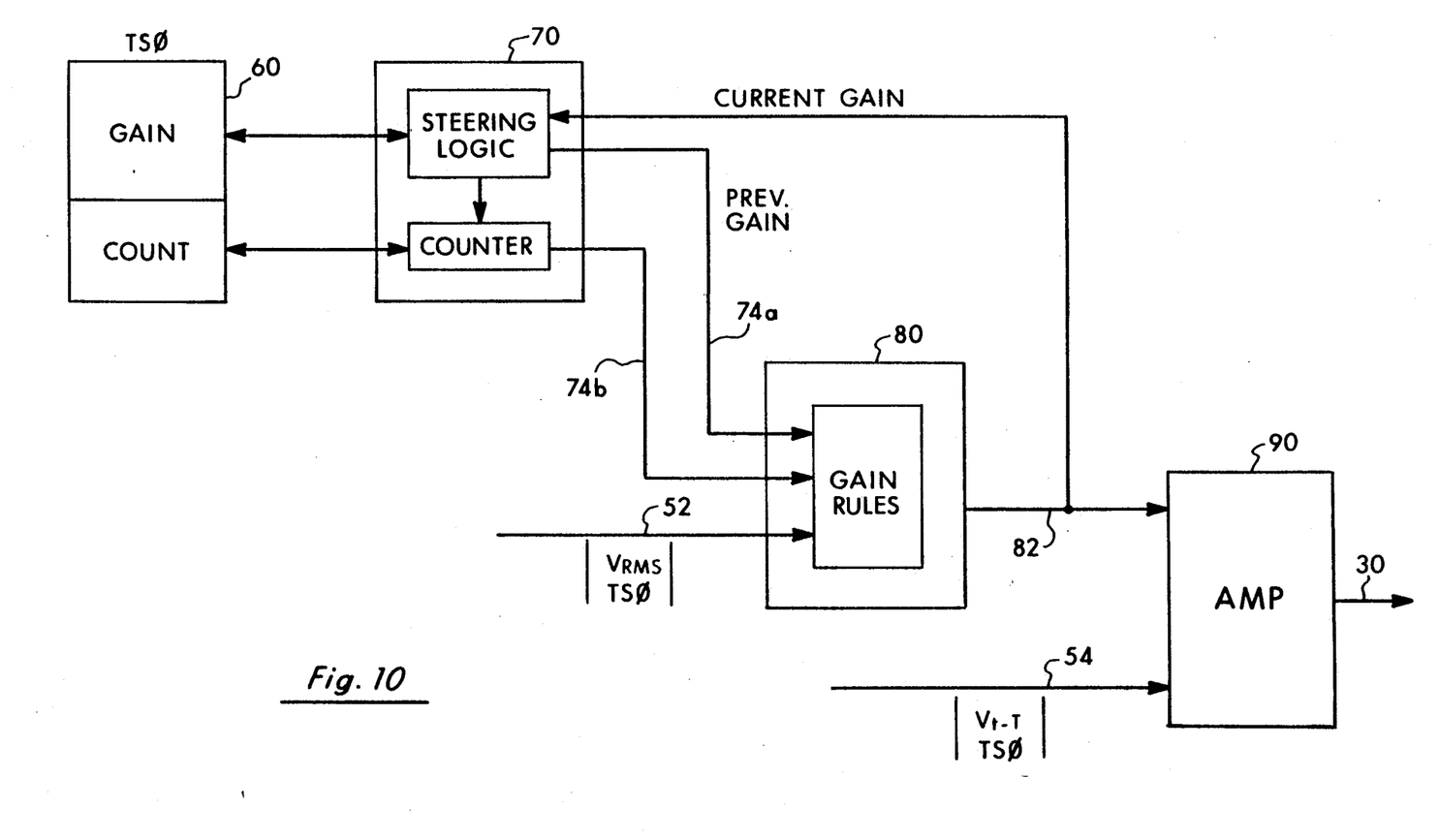
FIG. 10 sets forth an illustrative block diagram setting forth the operation of the AGC of the present invention.

In FIG. 10, the operation of the AGC 10 of the present invention is illustrated for time slot zero. In this illustration, the forward estimation of $V_{RMS}$ for time slot zero is delivered on lines 52 to the AGC look-up table 80. $V_{t-T}$ for TS0 is delivered on line 54. The AGC will function to deliver on line 82 an appropriate gain setting for amplifier 90 to deliver a suitably amplified or attenuated $V_{t-T}$ signal on line 30. This occurs in a pure digital format and the purpose of the AGC circuit 10 of the present invention is to eliminate oscillations of gain and to minimize distortion of the output audio signal on line 30. The following discussion will be for time slot TS0.

The gain history memory 60 is addressed so that the previous GAIN and COUNT values corresponding for time slot TS0 are delivered over lines 62 and 64 to the control circuit 70. The previous GAIN is also delivered over line 74a to the AGC look-up table 80 as well as whether COUNT=0 over line 74b. The forward estimate $V_{RMS}$ for time slot TS0 is delivered over lines 52 and $V_{t-T}$ for time slot TS0 is delivered on lines 54. The AGC look-up table 80 determines according to the aforesaid gain rules the current gain setting for the amplifier 90.

It is important to keep in mind that the value on line 74a is the previous GAIN value and the purpose of the AGC circuit 10 is to determine a modified GAIN value for amplification or attenuation in circuit 90 of delayed digitized speech on line 54 $V_{t-T}$. If the previous GAIN on line 74a is correct, then the output on line 82 is such so as not to change the previous GAIN value. However, if the previous GAIN is such that $V_{t-T}$ requires amplification, then the gain rules in circuit 80 output the new gain on line 82 increasing the previous GAIN by 1 dB. Likewise, if the GAIN rules in circuit 80 determine that the value of $V_{t-T}$ is such to be decreased, then the new gain generated on lines 82 is decreased by 1 dB. GAIN cannot be increased more than one dB or decreased by more than one dB under the gain rules of the present invention. However, it is to be expressly understood that the present invention is not limited in the value of GAIN increment or decrement. It is to be also understood that the increasing gain value need not be equal to the decreasing gain value.

The control circuit 70 also determines whether or not GAIN is to be changed. However, it does not change GAIN unless the value of COUNT in memory 60 which is delivered over line 64 equals zero. If the COUNT is zero (which is sent over line 74b), then the GAIN value for TS0 in memory 60 is incremented or decremented by 1 dB under the gain rules. The count is initialized to a value greater than zero.

The COUNT value performs an important function. This provides a time factor sufficiently long enough to eliminate oscillation yet minimize distortion. In the preferred embodiment, the COUNT is 32. Hence, 32 values of $V_{RMS}$ are presented for a time slot on lines 52 before the COUNT is determined to be zero. At that point in time (i.e., COUNT=0), the output of the AGC look-up table 80 is used to increase, decrease, or leave the same, the previous GAIN value stored in memory 60. At that time (i.e., COUNT equals zero), the GAIN value is delivered over lines 82 to the amplifier 90 to amplify $V_{t-T}$ accordingly. Hence, GAIN can only be changed every 4 milliseconds.

The AGC circuitry of the present invention is capable of examining all 32 channels every 125 microseconds (i.e., each channel takes 3.9 microseconds).

When the attack and decay control circuit 70 detects the COUNT to be zero, it proceeds to load the modified GAIN value into memory 60 (if changed) and to load the value of 32 into the COUNT portion.

The AGC look-up table 80 as mentioned is a single EPROM and with the GAIN being expressed in five bits on lead lines 82, the amplifier 90 is designed to convert the PCM values appearing on line 54 to linear values, then multiply the linear values by the value of GAIN and then to convert the linear product back into PCM for delivery as an amplified or attenuated signal on lines 30.

It is to be expressly understood that the claimed invention is not to be limited to the description of the preferred embodiment but encompasses other modifications and alterations within the scope and spirit of the inventive concept.

I claim:

1. An automatic gain control circuit (10) for controlling the gain of a inputted multiplexed PCM data stream, said inputted multiplexed data stream (20) having a predetermined number of time slots TS with each said time slot carrying PCM speech data (260), said control circuit comprising:

means (50) for determining the root-mean-square PCM values (270) of said inputted multiplexed data stream, said determining means comprising:
   (a) means (210) receptive of said inputted multiplexed PCM data stream having a data rate in the range of 192-250 kilobytes per second for storing said PCM speech data in reference to said predetermined number of said time slots, said storing means holding a predetermined number of samples T of said predetermined number of said time slots, (b) means (200, 220, 230, 240, 250) receptive of current PCM speech data $V_t$ in each of said predetermined number of time slots in said inputted multiplexed data stream and receptive of delayed PCM speech data $V_{t-T}$ from said storing means in the corresponding time slot occurring said predetermined number of samples ago for digitally ascertaining in linear format at said data rate the PCM root-mean-square value $V_{RMS}$ for said current PCM speech data, means (60, 70, 80, 90) connected to said determining means for digitally amplifying said PCM speech data in each said time slot by a gain value based upon said root-mean-square values.

2. The automatic gain control circuit of claim 1 wherein said PCM format is in $\mu$-Law companded format.

3. The automatic gain control circuit of claim 1 wherein said PCM format is in A-Law companded format.

4. The automatic gain control circuit of claim 1 wherein said delayed PCM speech data $V_{t-T}$ is delivered from said automatic gain control circuit in the same time slot.

5. An automatic gain control circuit (10) for controlling the gain of an inputted multiplexed PCM data stream, said inputted multiplexed data stream (20) having a predetermined number of time slots TS with each said time slot carrying PCM speech data (260), said control circuit comprising:

means (50) for determining the root-mean-square PCM values (270) of said inputted multiplexed data stream, said determining means comprising:

(a) means (210) receptive of said inputted multiplexed PCM data stream having a data rate in the range of 192-256 kilobytes per second for storing said PCM speech data in reference to said predetermined number of said time slots, said storing means holding a predetermined number of samples T of said predetermined number of said time slots, (b) means (200, 220, 230, 240, 250) receptive of current PCM speech data $V_t$ in each of said predetermined number of time slots in said inputted multiplexed data stream and connected to said storing means to be receptive of delayed PCM speech data $V_{t-T}$ in the corresponding time slot occurring said predetermined number of samples ago for digitally ascertaining in linear format at said data rate the PCM root-mean-square value $V_{RMS}$ for said current PCM speech data, means (60, 70, 80, 90) connected to said determining means for digitally amplifying said PCM speech data in each said time slot by a gain value based upon said root-mean-square values, and means in said ascertaining means for changing the PCM companding format of said automatic gain control circuit.

6. An automatic gain control circuit (10) for controlling the gain of an inputted multiplexed PCM data stream, said inputted multiplexed data stream (20) having a predetermined number of time slots TS with each said time slot carrying PCM speech data (260), said control circuit comprising:

means (50) for determining the root-mean-square PCM values (270) of said inputted multiplexed data stream, said determining means comprising:

(a) means (210) receptive of said inputted multiplexed PCM data stream having a data rate in the range of 192-256 kilobytes per second for storing said PCM speech data in reference to said predetermined number of said time slots, said storing means holding a predetermined number of samples T of said predetermined number of said time slots, (b) means (200) receptive of current PCM speech data $V_t$ in each of said predetermined number of time slots in said inputted multiplexed data stream and connected to said storing means to be receptive of delayed PCM speech data $V_{t-T}$ in the corresponding time slot occurring said predetermined number of samples ago for determining the linear sum of squares $\Sigma(LINEAR13(V))^2$ of all speech data in each said time slot over said predetermined number of samples as stored in said storing means, (c) means (240, 250) connected to said determining means for ascertaining the root-mean-square value $V_{RMS}$ for said current PCM speech data by dividing the said linear sum of squares by said predetermined number of samples to produce an average and by then taking the square root of said average, means (60, 70, 80, 90) connected to said determining means (50) for digitally amplifying said PCM speech data in each said time slot by a gain value based upon said root-mean-square values.

7. An automatic gain control circuit (10) for controlling the gain of an inputted multiplexed PCM data stream, said inputted multiplexed data stream (20) having a predetermined number of time slots TS with each said time slot carrying PCM speech data (260), said control circuit comprising:

means (50) for determining the root-mean-square PCM values (70) of said inputted multiplexed data stream, said determining means comprising:

(a) means (210) receptive of said inputted multiplexed PCM data stream for storing said PCM speech data in reference to said predetermined number of said time slots, said storing means holding a predetermined number of samples T of said predetermined number of said time slots, (b) means (200) receptive of current PCM speech data $V_t$ in each of said predetermined number of time slots in said inputted multiplexed data stream and connected to said storing means to be receptive of a delayed PCM speech data $V_{t-T}$ in the corresponding time slot occurring said predetermined number of samples ago for determining the difference in linear format LD between the squares of said current PCM speech data and of said delayed PCM speech data $(LINEAR13(V_t))^2 - (LINEAR13(V_{t-T})^2$, (c) means (230) for accumulating the linear value of the sum of squares ($\rho$LINEAR13) of all speech data in each said time slot over said predetermined number of samples as stored in said storing means, (d) means (220) connected to said determining means and to said accumulating means for adding said difference to said existing sum of squares so that the linear value of said sum of squares is updated to include said current PCM speech data and not to include said delayed PCM speech data, said accumulating means receiving the linear value of said updated sum of squares, (e) means (240, 250) connected to the adding means for ascertaining the root-mean-square value $V_{RMS}$ for said current PCM speech data by dividing the linear value of said updated sum of squares by said predetermined number of samples to produce an average and by then taking the square root of said average, and means (60, 70, 80, 90) connected to said determining means for digitally amplifying said PCM speech data in each said time slot by a gain value based upon said root-mean-square values.

8. The device of claim 7 wherein said PCM format is in μ-Law companded format.

9. The device of claim 7 wherein said PCM format is in A-Law companded format.

10. The device of claim 7 wherein said delayed PCM speech data $V_{t-T}$ is delivered from said device in the same time slot.

11. The device of claim 7 wherein said storing means is a random access memory.

12. The device of claim 7 wherein said determining means is an EPROM look-up table.

13. The device of claim 7 wherein said accumulating means is a read/write static memory.

14. The device of claim 7 wherein said ascertaining means is an EPROM look-up table.

15. The device of claim 7 wherein said determining means outputs said difference in a pipeline of linear partial values (500), wherein said accumulating means outputs said existing sum of squares in said pipeline of linear partial values, and wherein said adding means adds said partial values from said determining means and said accumulating means in said pipeline.

16. An automatic gain control circuit (10) for controlling the gain applied to an inputted multiplexed PCM data stream having a data rate in the range of 192-256 kilobytes, said inputted multiplexed data stream (20) having a predetermined number of time slots TS with each said time slot carrying PCM speech data (260), said control circuit comprising:

means (50) receptive of said inputted multiplexed PCM data stream for digitally ascertaining in linear format at said data rate the root-mean-square value for the speech data in each time slot in said inputted multiplexed PCM data stream, said root-mean-square value being determined over a predetermined number of samples of each said time slot, means (60) for storing COUNT and GAIN values for said inputted multiplexed PCM data stream, said count value having a maximum value corresponding to a selected number of root-mean-square values and said GAIN value corresponding to said gain applied to said PCM speech data, means (70) connected to said storing means for controlling said COUNT and GAIN values for each said time slot, means (80) connected to said controlling means and to said digitally ascertaining means for modifying said GAIN value in said storing means for said speech data in each said time slot when said root-mean-square value of said speech data in each said time slot requires a gain that:

a. is above said GAIN value in said storing means, then incrementing said GAIN value to a higher modified value, b. is equal to said GAIN value in said storing means, then leaving said GAIN value unchanged, c. is below said GAIN value in said storing means, then decrementing said GAIN value to a lower modified value, said modified GAIN value being delivered back to said controlling means, said controlling means either (a) when said COUNT value equals zero, writing said modified GAIN and writing said maximum value for said COUNT value into said storing means of (b) when said COUNT value does not equal zero, decrementing said count value and writing said decremented COUNT value into said storing means for each said time slot, means (90) connected to said controlling means and to said ascertaining means for amplifying said PCM speech data in each said time slot by said GAIN value in said storing means.

17. An automatic gain control circuit (10) for controlling the gain of an inputted multiplexed PCM data stream, said inputted multiplexed data stream (20) having a predetermined number of time slots TS with each said time slot carrying PCM speech data (260), said control circuit comprising:

means (50) receptive of said inputted multiplexed PCM data stream for digitally ascertaining in linear format the root-mean-square value for the speech data in each time slot in said inputted multiplexed PCM data stream, said root-mean-square value being determined over a predetermined number of samples of each said time slot, means (60) for storing COUNT and GAIN values for said inputted multiplexed PCM data stream, said COUNT value having a maximum value corresponding to a selected number of root-mean-square values and said GAIN value corresponding to said gain applied to said PCM speech data, means (70) connected to said storing means for controlling said COUNT and GAIN values for each said time slot, means (80) connected to said controlling means and to said digitally ascertaining means for modifying said GAIN value for said speech data in each said time slot according to a predetermined set of rules, said modified GAIN value being delivered back to said controlling means, said controlling means either (a) when said COUNT value equals zero, writing said modified GAIN and writing said maximum value for said COUNT value into said storing means or (b) when said COUNT value does not equal zero, decrementing said COUNT value and writing said decremented COUNT value into said storing means for each said time slot, means (90) connected to said controlling means and to said ascertaining means for amplifying said PCM speech data in each said time slot by said GAIN value in said storing means.

18. An automatic gain control circuit (10) for controlling the gain of an inputted multiplexed PCM data stream, said inputted multiplexed data stream (20) having a predetermined number of time slots TS with each said time slot carrying PCM speech data (260), said control circuit comprising:

means (50) receptive of said inputted multiplexed PCM data stream for digitally ascertaining in linear format the root-mean-square value for the speech data in each time slot in said inputted multiplexed PCM data stream, said root-mean-square value being determined over a predetermined number of samples of each said time slot, means (60, 70, 80) connected to said digitally ascertaining means for modifying the gain of said speech data in each said time slot based upon said root-mean-square value and a predetermined set of GAIN rules, means (90) connected to said modifying means for amplifying said PCM speech data in each said time slot by said modified GAIN.

19. An automatic gain control method (10) for controlling the gain of an inputted multiplexed PCM data stream having a data rate in the range of 1.5–2.1 megabytes, said inputted multiplexed data stream (20) having a predetermined number of time slots TS with each said time slot carrying PCM speech data (260), said method comprising the steps of:

digitally ascertaining in linear format at said data rate the root-mean-square value for the speech data in each time slot in said inputted multiplexed PCM data stream, said root-mean-square value being determined over a predetermined number of samples of each said time slot, storing COUNT and GAIN values in a storing means for said inputted multiplexed PCM data stream, said COUNT values having a maximum value corresponding to a selected number of root-mean-square values and said GAIN value corresponding to said gain applied to said PCM speech data, modifying the gain of said speech data in each said time slot when said root-mean-square value of said speech data requires a gain that:

a. is above said GAIN value in said storing means, then incrementing said GAIN value to a higher modified value, b. is equal to said GAIN value in said storing means, then leaving said GAIN value unchanged.

c. is below said GAIN value in said storing means, then decrementing said GAIN value to a lower modified value, said modified GAIN value being delivered back to a controlling means, said controlling means, either (a) when said COUNT value equals zero, writing said modified GAIN and writing said maximum value for said COUNT value into said storing means or (b) when said COUNT value does not equal zero, decrementing said COUNT value and writing said decremented COUNT value into said storing means for each said time slot, amplifying said PCM speech data in each said time slot by said GAIN value.

20. An automatic gain control method (10) for controlling the gain of an inputted multiplexed PCM data stream having a data rate in the range of 1.5–2.1 megabytes, said inputted multiplexed data stream (20) having a predetermined number of time slots TS with each said time slot carrying PCM speech data (260), said method comprising the steps of:

digitally ascertaining in linear format at said data rate the root-mean-square value for the speech data in each time slot in said inputted multiplexed PCM data stream, said root-mean-square value being determined over a predetermined number of samples of each said time slot, storing COUNT and GAIN values in a storing means for said inputted multiplexed PCM data stream, said COUNT values having a maximum value corresponding to a selected number of root-mean-square values and said GAIN value corresponding to said gain applied to said PCM speech data, modifying the gain of said speech data in each said time slot when said root-mean-square value of said speech data requires a gain that:

a. is above said GAIN value in said storing means, then incrementing said GAIN value to a higher modified value, b. is equal to said GAIN value in said storing means, then leaving said GAIN value unchanged, c. is below said GAIN value in said storing means, then decrementing said GAIN value to a lower modified value, said modified GAIN value being delivered back to a controlling means, writing said modified GAIN into said storing means for each time slot, and amplifying said PCM speech data in each said time slot by said modified GAIN.

* * * * *